United States Patent [19]

Wilcox

[11] Patent Number: 4,590,444
[45] Date of Patent: May 20, 1986

[54] VOLTAGE CONTROLLED RC OSCILLATOR CIRCUIT

[75] Inventor: Milton E. Wilcox, Saratoga, Calif.

[73] Assignee: National Semiconductor Corporation, Santa Clara, Calif.

[21] Appl. No.: 659,793

[22] Filed: Oct. 11, 1984

[51] Int. Cl.[4] .................. H03K 3/023; H03K 3/03
[52] U.S. Cl. .................................. 331/111; 331/143; 331/177 R
[58] Field of Search .............. 331/111, 143, 177 R, 331/108 D

[56] References Cited

U.S. PATENT DOCUMENTS 3,801,866 4/1974 Schmidgall .............. 331/108 D X

OTHER PUBLICATIONS

Cohn et al., "Square Wave Oscillator", Electronics Australia, vol. 41, No. 5, Aug. 1979, pp. 72, 73, 75, 76.
Tenny, "Linear VCO Made from a 555 Timer", Electronic Design, Oct. 11, 1975, p. 96.

Primary Examiner—Siegfried H. Grimm
Attorney, Agent, or Firm—Gail W. Woodward; Paul J. Winters; Michael J. Pollock

[57] ABSTRACT

A voltage controlled oscillator circuit is disclosed. A CMOS circuit version is detailed. A relaxation oscillator has its input coupled by way of a voltage follower buffer to the input terminal where the control voltage is applied. The operating frequency is determined by the circuit resistor and capacitor values along with the control potential. A linear frequency versus voltage response is obtained and the circuit will operate at low supply voltages.

4 Claims, 3 Drawing Figures

U.S. Patent   May 20, 1986   4,590,444
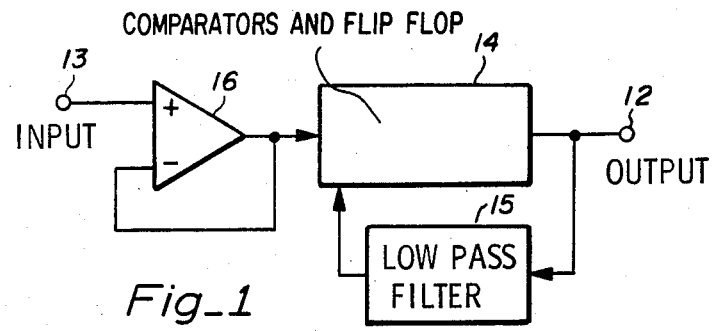
Fig_1
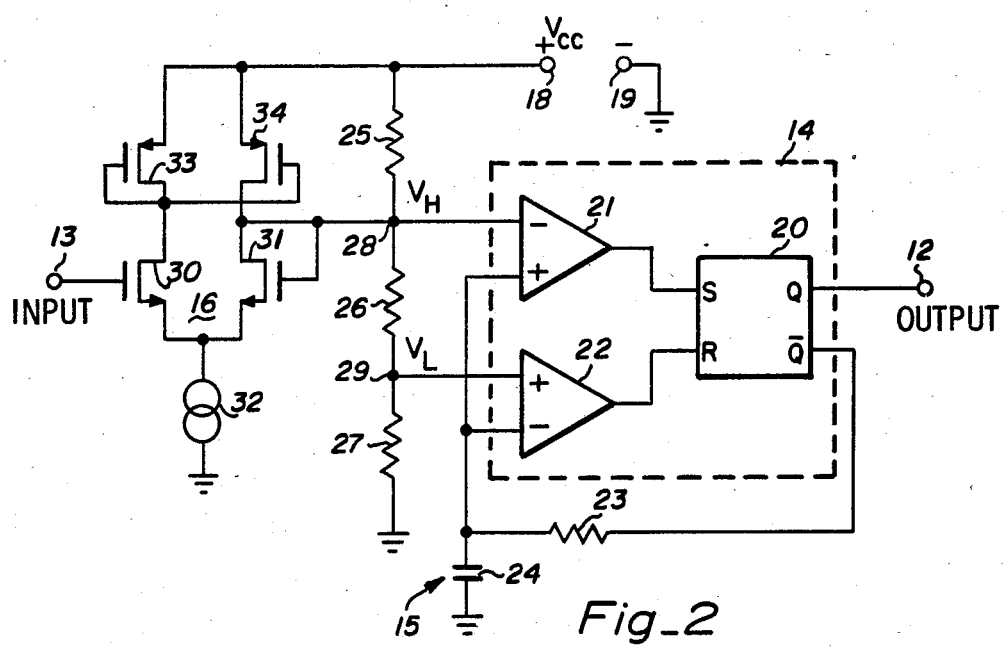
Fig_2
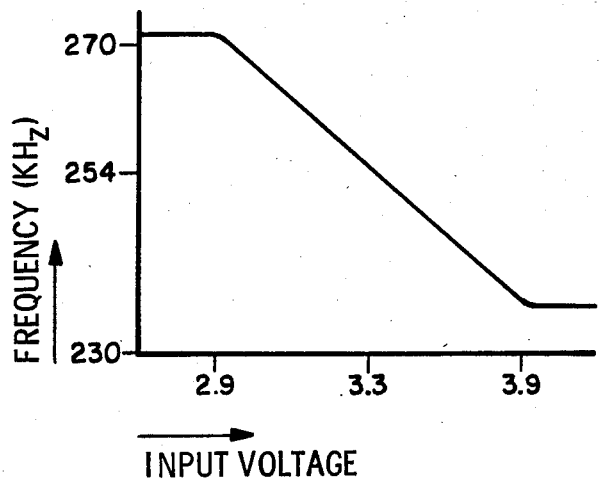
Fig_3

VOLTAGE CONTROLLED RC OSCILLATOR CIRCUIT

BACKGROUND OF THE INVENTION

The invention relates to a voltage controlled oscillator (VCO) useful in phase lock loop (PLL) systems wherein an oscillator is locked in phase with an incoming signal. The commercially available MM74HC4046 (formerly CD4046) is a complementary metal oxide silicon (CMOS) integrated circuit intended for PLL applications up to a maximum operating frequency of about 20 MHz. It consists essentially of a VCO and a phase comparator combination. The phase comparator responds to the VCO output and an incoming signal to produce a d-c output that, after filtering, controls the VCO to produce a phase lock.

In the VCO the timing capacitor is charged through a control circuit in first one direction then the other direction with the charging current being determined by the input voltage. This current is produced by a current mirror in which a fixed component can be determined by a resistor. A variable component related to the input voltage is combined in the mirror to provide the control function.

SUMMARY OF THE INVENTION

It is an object of the invention to provide a voltage controlled oscillator circuit having good linearity in terms of frequency versus voltage and is substantially insensitive to the supply voltage.

It is a further object of the invention to provide a voltage controlled oscillator circuit using CMOS construction that is capable of operating at a relatively low supply voltage while providing a linear frequency versus voltage response.

These and other objects are achieved in a circuit configured as follows. A relaxation oscillator is created from a combination of comparators and a flip-flop. This flip-flop has an output driving a low pass filter which couples to the oscillator input so as to create an oscillatory state. The oscillator has a second input coupled to the circuit input terminal by way of a voltage follower buffer. Thus, the relaxation oscillator does not load the input terminal. The voltage follower is made up of a differential amplifier with its inverting input directly connected to its output. This configuration means that the relaxation oscillator control input is forced to the input terminal potential. Thus, any change in input potential produces a shift in oscillator frequency in a highly linear manner.

BRIEF DESCRIPTION OF THE DRAWING

FIG. 1 is a block diagram of the circuit of the invention.

FIG. 2 is a combination block and schematic diagram of the CMOS version of the circuit of the invention.

FIG. 3 is a graph showing the frequency versus input voltage for the circuit of FIG. 2.

DESCRIPTION OF THE INVENTION

FIG. 1 is a block diagram showing the elements of the circuit of the invention. A signal output at terminal 12 has a frequency determined in part by the potential at input terminal 13. A relaxation oscillator is created from the comparators and flip-flop inside block 14. It operates by virtue of a feedback circuit shown as low pass filter 15. The filter components determine the basic oscillation frequency. A differential amplifier (diff amp) 16 has its output connected directly to its inverting input so that it acts as a voltage follower buffer. This ensures that the circuit will not load input terminal 13. Since the relaxation oscillator reacts to both the input voltage and the feedback its frequency can be modulated or varied by the potential at terminal 13, thus creating a VCO.

FIG. 2 is a combination schematic and block diagram of the circuit of the invention. It operates from a $V_{CC}$ 6 power supply connected + to terminal 18 and — to ground terminal 19. The circuit output at terminal 12 is a digital signal having a frequency determined in part by the potential at input terminal 13.

The heart of the circuit is a well known relaxation oscillator created around the comparators and flip-flop shown inside dashed outline 14. An RS flip-flop 20 is provided with high comparator 21 and low comparator 22. Resistor 23 and capacitor 24, which are ordinarily external to the IC, form the low pass filter 15 which is the fundamental frequency determining element for the circuit. Resistors 25–27 are normally inside the IC and form a voltage divider across the $V_{CC}$ supply. The potential at node 28 develops $V_H$ which is applied as a reference to comparator 21. The potential at node 29 develops $V_L$ which is applied as a reference to comparator 22.

Assuming at the outset that capacitor 24 is discharged the output of comparator 22 will be high and flip flop 20 will be in its reset state so that Q is low and $\bar{Q}$ is high. For this state capacitor 24 will charge through resistor 23. When the charge on capacitor 24 exceeds the $V_H$ potential at node 28 the output of comparator 21 will go high and trigger flip flop 20 to its set state. Q goes high and $\bar{Q}$ goes low. Capacitor 24 will now discharge through resistor 23. When the charge falls below $V_L$ at node 29 the output of comparator 22 will go high and reset flip flop 20. This series of events will repeat and the charge on capacitor 24 will cycle between $V_H$ and $V_L$.

If resistors 25–27 are matched, $V_H$ will be $2V_{CC}/3$ and $V_L$ will be $V_{CC}/3$. Thus, the cycling of capacitor 24 develops a peak to peak signal of $V_{CC}/3$. This means that the waveform across capacitor 24 is a substantially linear sawtooth. If $V_H$ is varied $V_L$ will follow at $V_H/2$ and the oscillator frequency will vary in an inverse relationship to the potential at node 28.

Diff amp 16 is connected as a voltage follower between input terminal 13 and node 28. Thus, $V_H$ will be determined by the potential at terminal 13. N channel transistors 30 and 31 are connected differentially with their tail current determined by current sink 32. P channel transistors 33 and 34 form a current mirror load to provide a single ended output. The gate of transistor 31 which is the inverting input is returned to its drain to provide 100% feedback for the voltage follower function.

When input terminal 13 is at $2V_{CC}/3$, $V_H$ will be determined solely by resistors 25–27. This is the oscillator center frequency. When the input deviates from this value the potential at node 28 will follow, thus modulating $V_H$ (and $V_L$) so that the oscillator frequency is deviated. In effect diff amp 16 will source or sink current into or out of node 28. This will raise or lower $V_H$ to follow the potential at terminal 13. The value of tail current in sink 32 will determine the degree to which $V_H$ can be varied, thus setting the frequency range of the VCO. If the current in sink 32 is proportional to $V_{CC}$, then the degree to which $V_H$ can be varied will be a constant percentage of $V_{CC}$, resulting in an oscillator frequency range independent of supply.

FIG. 3 is a graph of a typical frequency versus voltage curve. The center of the curve is at 3.33 volts (for a $V_{CC}$ of 5 volts. It can be seen that the curve is essentially linear over the range of about 2.9 volts to about 3.9 volts. Over this range the frequency varied from about 236 kHz to about 272 kHz. This is a center frequency of about 254 kHz with a ±7% deviation. This performance was obtained using conventional P well CMOS IC parts to accomplish the circuit functions. Capacitor 24 was 250pf and resistor 23 was 10k ohms. Resistors 25–27 were each 50k ohms, and current source 32 was 7.2 μA.

The oscillator frequency was a function of the input potential with the curve of FIG. 3 applying. Increasing current source 32 to 15 μA doubled the deviation to +/−15% at a $V_{CC}$ of 5 V. The oscillator center frequency was substantially independent of the supply voltage and the circuit functioned well at a supply voltage as low as 2 volts.

While a CMOS circuit version is preferred and illustrated, it is to be understood that other types of IC can be employed. For example, NMOS, PMOS, or bipolar construction could also be employed.

The invention has been described and an operating example detailed. When a person skilled in the art reads the foregoing description alternatives and equivalents, within the spirit and intent of the invention, will be apparent. Accordingly, it is intended that the scope of the invention be limited only by the following claims.

I claim:

1. A voltage controlled oscillator circuit having an input terminal to which a frequency controlling voltage can be applied and an output terminal at which an oscillatory signal appears, said circuit comprising:

first and second supply terminals connectible to a source of operating power;

a relaxation oscillator including high and low comparators coupled to drive the R and S inputs of an RS flip-flop having an output terminal which constitutes said circuit output terminal, said relaxation oscillator having a control input terminal and a feedback input terminal;

said relaxation oscillator further including a frequency determining capacitor coupled between said feedback input terminal and one of said supply terminals and a frequency determining resistor coupled between said relaxation oscillator output and feedback input terminals whereby said relaxation oscillator will oscillate to charge and discharge said capacitor; and a voltage follower buffer coupled between said circuit input terminal and said control input terminal of said relaxation oscillator.

2. The circuit of claim 1 wherein said relaxation oscillator further includes high and low reference input terminals coupled to said high and low comparators and said circuit further includes a voltage divider coupled across said first and second supply terminals and having taps coupled to said high and low reference input terminals that develop high and low reference potentials whereby said capacitor charge varies between said high and low reference potentials.

3. The circuit of claim 2 wherein said voltage divider comprises three matched resistors and said high reference potential is nominally two-thirds of the value of said source of operating power and said low reference potential is half of the value of said high reference potential.

4. The circuit of claim 1 wherein said voltage follower buffer comprises:

first and second N channel transistors having their sources coupled together to create a differential pair, their gates respectively coupled to said circuit input terminal and said relaxation oscillator control input terminal, and drain electrodes;

first and second P channel transistors having their sources coupled together to said first supply terminal, their gates coupled together to the drain of said first P channel transistor and to said drain of said first N channel transistor, and means coupling the drain of said second P channel transistor to the drain of said second N channel transistor and to said relaxation oscillator control input terminal whereby said P channel transistors serve as a current mirror load for said differential pair; and a constant current sink coupled between said sources of said N channel transistors and said second supply terminal.

* * * * *